US012660579B2

(12) United States Patent
Hwang et al.

(10) Patent No.: US 12,660,579 B2
(45) Date of Patent: Jun. 16, 2026

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventors: Sang Il Hwang, Wonju-si (KR); Jong Ho Lee, Eumseong-gun (KR)

(73) Assignee: DB HiTek Co., Ltd., Bucheon-si (KR)

( * ) Notice: Subject to any disclaimer, the term of this patent is extended or adjusted under 35 U.S.C. 154(b) by 356 days.

(21) Appl. No.: 18/467,880

(22) Filed: Sep. 15, 2023

(65) Prior Publication Data

US 2025/0046649 A1 Feb. 6, 2025

(30) Foreign Application Priority Data

Jul. 31, 2023 (KR) ........................ 10-2023-0099421

(51) Int. Cl.
| | |
|---|---|
| *H10W 10/17* | (2026.01) |
| *H10D 30/60* | (2025.01) |
| *H10D 30/65* | (2025.01) |
| *H10D 62/10* | (2025.01) |
| *H10W 10/00* | (2026.01) |
| *H10W 10/20* | (2026.01) |

(52) U.S. Cl.
CPC .......... *H10W 10/17* (2026.01); *H10D 30/603* (2025.01); *H10D 30/65* (2025.01); *H10D 62/115* (2025.01); *H10W 10/0145* (2026.01); *H10W 10/021* (2026.01); *H10W 10/20* (2026.01)

(58) Field of Classification Search
CPC ............................ H10D 62/115; H10W 10/17
See application file for complete search history.

(56) References Cited

U.S. PATENT DOCUMENTS

| | | | | |
|---|---|---|---|---|
| 11,018,060 B2 * | 5/2021 | Kang | ................ | H01L 21/76819 |
| 12,419,088 B2 * | 9/2025 | Ho | ........................ | H01L 21/743 |
| 2017/0047338 A1 * | 2/2017 | Shinohara | ............. | H01L 21/762 |
| 2023/0131599 A1 | 4/2023 | Chen | | |
| 2023/0187267 A1 * | 6/2023 | Hwang | ................ | H10D 30/603 |
| | | | | 257/522 |
| 2023/0187268 A1 * | 6/2023 | Park | ................... | H10D 30/0221 |
| | | | | 257/343 |

FOREIGN PATENT DOCUMENTS

KR 1020010036629 A 5/2001

* cited by examiner

*Primary Examiner* — Daniel Luke
(74) *Attorney, Agent, or Firm* — Bridgeway IP Law Group, PLLC; Jihun Kim

(57) ABSTRACT

Proposed is a high voltage semiconductor device and a method of manufacturing the same and, more particularly, a high voltage semiconductor device and a method of manufacturing the same for positioning the upper end of an air gap formed in a DTI region at a relatively deep position in the DTI region by forming the bottom of the upper region of the DTI region at a deeper position in a substrate compared to the bottom of a STI region.

9 Claims, 15 Drawing Sheets

HIGH VOLTAGE SEMICONDUCTOR DEVICE AND METHOD OF MANUFACTURING SAME

CROSS REFERENCE TO RELATED APPLICATION

The present application claims priority to Korean Patent Application No. 10-2023-0099421, filed Jul. 31, 2023, the entire contents of which is incorporated herein for all purposes by this reference.

BACKGROUND OF THE INVENTION

Field of the Invention

The present disclosure relates to a high voltage semiconductor device and a method of manufacturing the same. More particularly, the present disclosure relates to a high voltage semiconductor device and a method of manufacturing the same for positioning the upper end of an air gap formed in a DTI region at a relatively deep position in the DTI region by forming the bottom of the upper region of the DTI region at a deeper position in a substrate compared to the bottom of a STI region.

Description of the Related Art

In recent Bipolar-CMOS-DMOS (BCD) processes, it is required to achieve a high breakdown voltage of 100V or more, and according to this high voltage requirement, a process of forming a deep trench isolation (DTI) region is used to prevent an increase in leakage current through electrical isolation between adjacent devices.

FIG. 1 is a cross-sectional view showing a conventional high voltage semiconductor device.

Referring to FIG. 1, in a conventional high voltage semiconductor device 9, in order to locate an isolation region 91 at a sufficiently deep position within a substrate 901, the isolation region 91 is formed in two stages such as a Pre-DTI region 911 and a DTI region 913. That is, the Pre-DTI region 911 is formed to pass through an interlayer insulating layer 920 and a STI region 930 on the substrate 901, and the DTI region 913 is connected to the bottom of the Pre-DTI region 911 and extends to a predetermined depth in the substrate 901. In this configuration, the bottom of the Pre-DTI region 911 is positioned at substantially the same depth as the bottom of the STI region 930 in the substrate 901.

In addition, an air gap AG is formed in the isolation region 91. When the upper end of the air gap AG is formed at a height (or depth) adjacent to the surface of the substrate 901, the possibility of cracks occurring in the Pre-DTI region 911 on the upper side of the air gap AG in a subsequent process cannot be ruled out. For example, when a subsequent process such as a contact process is performed, tungsten (W) remains inside the space created by the crack, which may cause a defect in the semiconductor device 9.

Thus, it is advantageous that the upper end of the air gap AG is formed at a position as deep as possible within the isolation region 91 in order to prevent cracks and resultant defects from occurring in subsequent processes.

To solve the above problems, the inventor of the present disclosure proposes a novel high voltage semiconductor device and a method of manufacturing the same to prevent cracks from occurring by forming the upper end of the air gap at a relatively low height (or deep position) in the DTI region, which will be described in detail later.

DOCUMENT OF RELATED ART (Patent Document 1) Korean Patent Application Publication No. 10-2003-0000592 "METHOD OF MANUFACTURING SEMICONDUCTOR DEVICE HAVING STI/DTI STRUCTURE"

SUMMARY OF THE INVENTION

The present disclosure is directed to a high voltage semiconductor device and a method of manufacturing the same. The objective of the present disclosure is to position the upper end of an air gap formed in a DTI region at a relatively deep position in the DTI region by forming the bottom of the upper region of the DTI region at a deeper position in the substrate compared to the bottom of a STI region.

Furthermore, the present disclosure aims to prevent device defects caused by cracks on the upper side of the DTI region and residual impurities resulting therefrom in a subsequent process by forming the upper part of the air gap relatively deep in the DTI region.

Additionally, the present disclosure seeks to enhance process efficiency by forming an open extension region using an etching process without a separate mask pattern after forming a first trench and a second trench.

Moreover, the present disclosure endeavors to reduce the formation of scallops along the upper inner wall of the second trench through a non-Bosch process for forming the open extension region.

Lastly, the present disclosure aims to eliminate a step between an upper region and an interlayer insulating layer adjacent thereto by depositing an upper insulating layer on the interlayer insulating layer and performing a CMP process after forming the DTI region.

The disclosure may be implemented by embodiments having the following configuration in order to achieve the above-described objectives.

According to an embodiment of the present disclosure, a high voltage semiconductor device may include: a substrate; a gate electrode on the substrate; a STI region formed as an isolation layer in the substrate; a DTI region in the substrate; and an air gap in the DTI region, wherein the DTI region may include: an upper region at least partially overlapping the STI region; and a lower region extending downward from a bottom of the upper region, wherein the bottom of the upper region may be located at a lower position than a bottom of the STI region.

According to another embodiment of the present disclosure, the high voltage semiconductor device of the present disclosure may further include: an interlayer insulating layer covering the gate electrode on the substrate, wherein the upper region may penetrate the interlayer insulating layer.

According to still another embodiment of the present disclosure, the high voltage semiconductor device of the present disclosure may further include: an upper insulating layer on the interlayer insulating layer.

According to still another embodiment of the present disclosure, in the high voltage semiconductor device of the present disclosure, a depth of the bottom of the upper region from a surface of the substrate may be greater than 1.5 times or less than 2.5 times that of the STI region.

According to still another embodiment of the present disclosure, in the high voltage semiconductor device of the present disclosure, the upper region may be formed by a plurality of etching processes.

According to still another embodiment of the present disclosure, a high voltage semiconductor device of the present disclosure may include: a substrate; a substrate; a buried layer of a second conductivity type in the substrate; a deep well region connected to the buried layer of the second conductivity type; a first well region in the deep well region; a gate electrode on the substrate; an interlayer insulating layer covering the gate electrode on the substrate; a STI region formed as an isolation layer in the substrate; a DTI region penetrating the STI region and the substrate; and an air gap in the DTI region, wherein the DTI region may include: an upper region; and a lower region extending downward from a bottom of the upper region and having a width narrower than that of the upper region, wherein the bottom of the upper region may be located at a lower position than a bottom of the STI region in the substrate.

According to still another embodiment of the present disclosure, in the high voltage semiconductor device of the present disclosure, a depth of the bottom of the upper region from a surface of the substrate may be greater than 1.8 times or less than 2.1 times that of the STI region.

According to still another embodiment of the present disclosure, in the high voltage semiconductor device of the present disclosure, the upper region may have a narrower width than the STI region.

According to still another embodiment of the present disclosure, the high voltage semiconductor device of the present disclosure may further include: a drain region of a second conductivity type disposed in the first well region adjacent to a surface of the substrate; a body region of a first conductivity type in the substrate; and a source region of a second conductivity type disposed in the body region adjacent to the surface of the substrate.

According to still another embodiment of the present disclosure, in the high voltage semiconductor device of the present disclosure, the upper region may be formed by a plurality of non-Bosch processes.

According to an embodiment of the present disclosure, a method of manufacturing a high voltage semiconductor device may include: forming a first trench by etching a STI region; forming a second trench by etching a substrate under the first trench; forming an open extension region by etching a portion of the substrate in contact with a bottom of the first trench; and depositing a first insulating layer in the first trench, the second trench, and the open extension region.

According to another embodiment of the present disclosure, in the method of manufacturing a high voltage semiconductor device, the open extension region may have a wider width than the second trench.

According to still another embodiment of the present disclosure, in the method of manufacturing a high voltage semiconductor device, the open extension region may be formed by a non-Bosch process.

According to still another embodiment of the present disclosure, the method of manufacturing a high voltage semiconductor device may further include: performing an etch-back process on the first insulating layer; and depositing a second insulating layer in the first trench, the second trench, and the open extension region, and on the first insulating layer.

According to still another embodiment of the present disclosure, the method of manufacturing a high voltage semiconductor device may further include: sequentially depositing an interlayer insulating layer and an etch stop layer on the substrate before forming the first trench; and removing the second insulating layer on the etch stop layer after depositing the second insulating layer.

According to still another embodiment of the present disclosure, the method of manufacturing a high voltage semiconductor device may further include: removing the etch stop layer; and depositing an upper insulating layer on the interlayer insulating layer.

According to still another embodiment of the present disclosure, the method of manufacturing a high voltage semiconductor device may further include: performing a CMP process on the upper insulating layer.

According to still another embodiment of the present disclosure, in the method of manufacturing a high voltage semiconductor device, a distance from a top to a bottom of the open extension region may range from 0.5 to 1.5 times that of the STI region.

According to still another embodiment of the present disclosure, in the method of manufacturing a high voltage semiconductor device, a width of the open extension region may be narrower than that of the STI region.

According to still another embodiment of the present disclosure, in the method of manufacturing a high voltage semiconductor device, the second trench may be formed by a Bosch process.

The present disclosure offers several advantages through the aforementioned configuration.

Firstly, in accordance with the present disclosure, it becomes feasible to position the upper end of an air gap formed in a DTI region at a relatively deep position in the DTI region by forming the bottom of the upper region of the DTI region at a deeper position in the substrate compared to the bottom of a STI region.

Furthermore, the present disclosure prevents device defects caused by cracks on the upper side of the DTI region and residual impurities resulting therefrom in a subsequent process by forming the upper part of the air gap relatively deep in the DTI region.

Additionally, the present disclosure enhances process efficiency by forming an open extension region using an etching process without a separate mask pattern after forming a first trench and a second trench.

Moreover, the present disclosure reduces the formation of scallops along the upper inner wall of the second trench through a non-Bosch process for forming the open extension region.

Lastly, the present disclosure eliminates a step between an upper region and an interlayer insulating layer adjacent thereto by depositing an upper insulating layer on the interlayer insulating layer and performing a CMP process after forming the DTI region.

Meanwhile, it is important to note that even if certain effects or advantages are not explicitly mentioned in this section, they are to be understood as inherent to the technical features of the present disclosure and their anticipated impact, as described in the following specification.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are only provided for reference in order to more completely explain the present disclosure to those of ordinary skill in the art.

Hereinafter, it should be noted that when one component (or layer) is described as being disposed on another component (or layer), one component may be disposed directly on another component, or another component(s) or layer(s) may be located between the components. In addition, when one component is expressed as being directly disposed on or above another component, no other component(s) are located between the components. Moreover, being located on "top", "upper", "lower", "top", "bottom" or "one (first) side" or "side" of a component means a relative positional relationship.

In addition, it should be noted that, where certain embodiments are otherwise feasible, certain process sequences may be performed other than those described below. For example, two processes described in succession may be performed substantially simultaneously or in the reverse order.

Moreover, the conductivity type or doped region of the components may be defined as "p-type" or "n-type" according to the main carrier characteristics, but this is only for convenience of description, and the technical spirit of the present disclosure is not limited to what is illustrated. For example, hereinafter, "p-type" or "n-type" will be used as more general terms "first conductivity type" or "second conductivity type", and here, the first conductivity type means p-type, and the second conductivity type means n-type.

Furthermore, it should be understood that "high concentration" and "low concentration" expressing the doping concentration of the impurity region mean the relative doping concentration of one component and another component.

Figure 2:
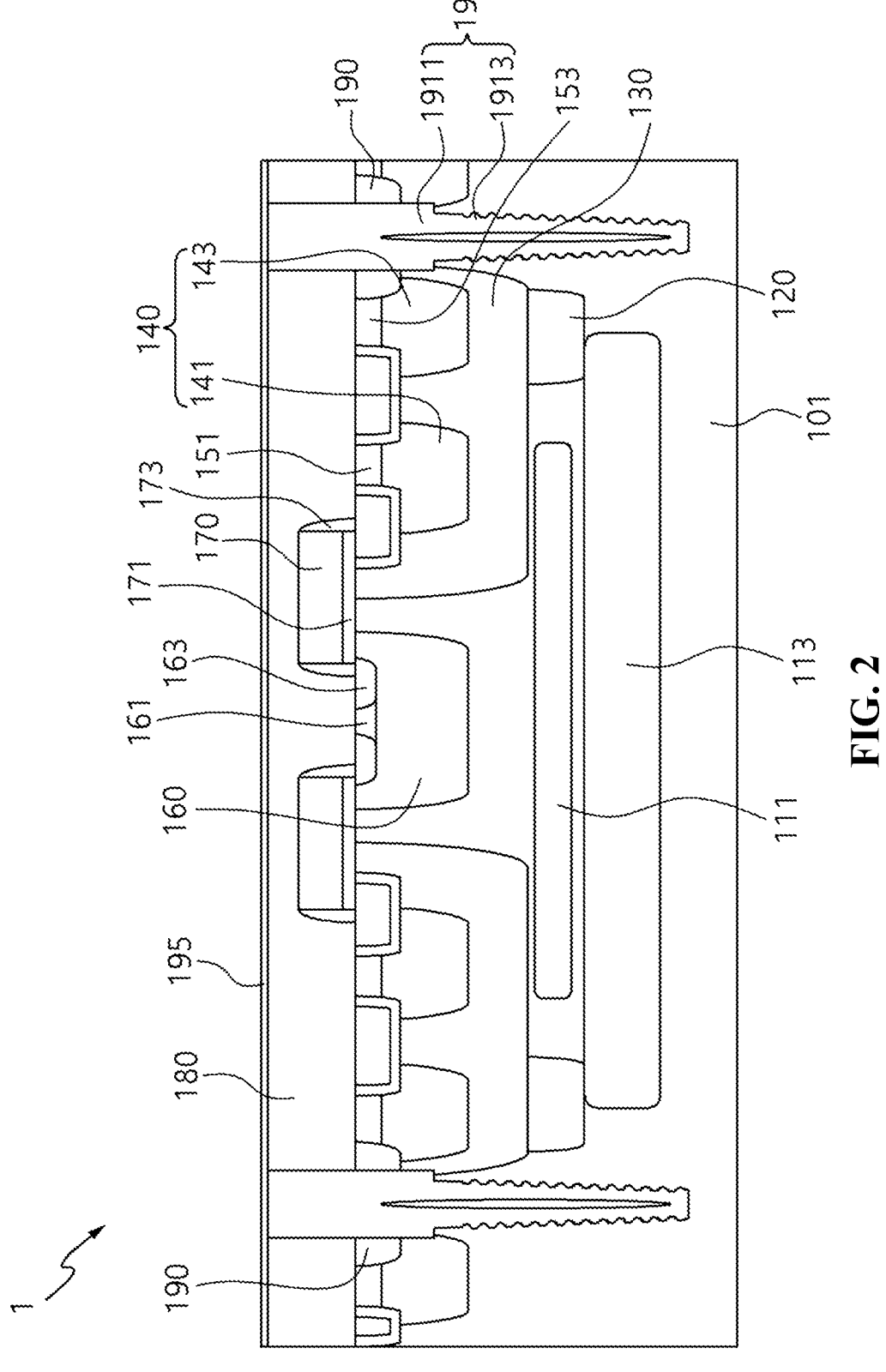
FIG. 2 is a cross-sectional view showing a high voltage semiconductor device according to an embodiment of the present disclosure.
Figure 3:
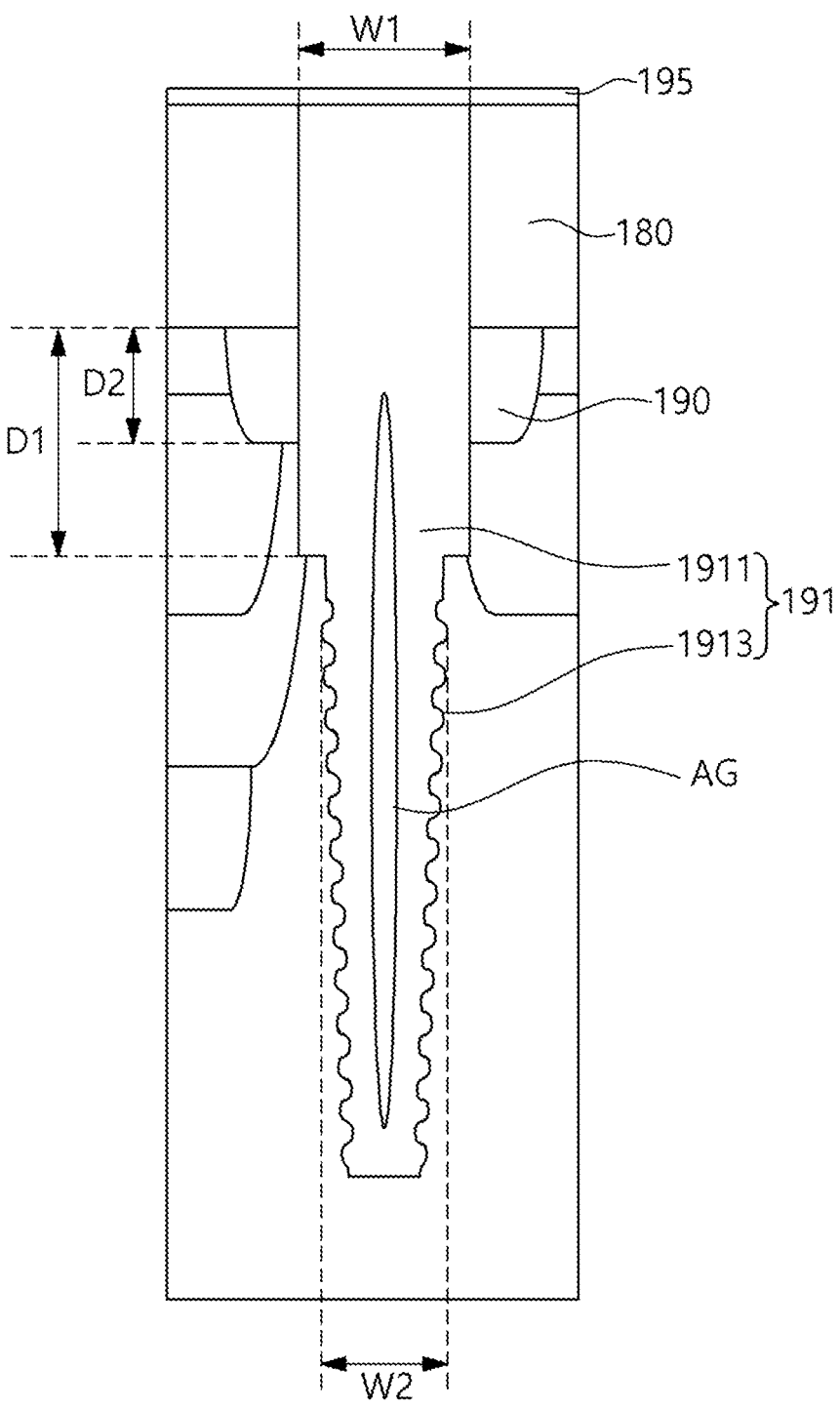
FIG. 3 is an enlarged view showing a DTI region according to FIG. 2.

FIG. 2 is a cross-sectional view showing a high voltage semiconductor device according to an embodiment of the present disclosure, and FIG. 3 is an enlarged view showing a DTI region according to FIG. 2.

Hereinafter, a high voltage semiconductor device 1 according to an embodiment of the present disclosure will be described in detail with reference to the accompanying drawings.

Referring to FIG. 2, the present disclosure relates to the high voltage semiconductor device 1 and, more particularly, to the high voltage semiconductor device 1 in which the upper end of an air gap AG formed in a DTI region 191 at a relatively deep position in the DTI region 191 by forming the bottom of an upper region 1911 of the DTI region 191 at a deeper position in a substrate 101 compared to the bottom of a STI region 190.

First, a substrate 101 is formed in the high voltage semiconductor device 1. A well region used as an active region may be formed in the substrate 101, and the well region may be defined by an STI region 190 as an isolation layer. In addition, the substrate 101 may be a substrate doped with a first conductivity type, a p-type diffusion region disposed in the substrate, or may include a p-type epitaxial layer epitaxially grown on the substrate. The STI region 190 may be formed by using a shallow trench isolation (STI) process, but is not limited thereto. In addition, the STI region 190 may overlap the DTI region 191 to be described later. That is, the DTI region 191 may be formed in a structure in which one side thereof passes through the STI region 190.

A first buried layer 111 and a second buried layer 113 may be formed in the substrate 101. For example, the first buried layer 111 may be formed on one upper side of the second buried layer 113. In addition, a high-voltage well region 120 may be formed to be connected to one side of the second buried layer 113. The high-voltage well region 120 is a second conductivity type impurity doped region (HVNWELL), and may be formed in the substrate 101 and on the second buried layer 113. The aforementioned first buried layer 111 may be an impurity-doped region of a first conductivity type, and the second buried layer 113 may be an impurity-doped region of a second conductivity type. In addition, it should be noted that the first buried layer 111 and the high-voltage well region 120 are not essential components of the present disclosure and may be omitted in some cases.

A deep well region 130 may be formed in the substrate 101 and on the high-voltage well region 120. The deep well region 130 has one side connected to the high-voltage well region 120 and may be a second conductivity type impurity doped region (DNWELL). The deep well region 130 may be formed to be directly connected to the second buried layer 113 in some cases.

In the deep well region 130, for example, a pair of well regions 140 (141, 143) of the second conductivity type may be formed, and a drain region 151 may be formed in a first well region 141 and a heavily doped region 153 may be formed in a second well region 143. The drain region 151 is a doped region of the second conductivity type and may be doped with a higher concentration of impurities than the first well region 141. The heavily doped region 153 is also a doped region of the second conductivity type and may be doped with a higher concentration of impurities than the second well region 143. The drain region 151 and the heavily doped region 153 may be spaced apart from each other by the STI region 190.

The drain region 151 and the heavily doped region 153 are preferably formed on the surface of the substrate 101. The above-described heavily doped region 153 functions as a guard ring together with the second well region 143 and the high-voltage well region 120 to reduce leakage current and improve safe operating area (SOA) conditions. The drain region 151 may be electrically connected to a drain electrode (not shown), and the well region 141 surrounding the drain region 151 is a drain extension region and may improve breakdown voltage characteristics of a high voltage semiconductor device.

A body region 160 may be formed in the substrate 101. The body region 160 is a heavily doped region of the first conductivity type, and may be formed to be spaced apart from the deep well region 130 or may be formed to contact the deep well region 130 with each other. A source region 163 is formed in the body region 160 and on the surface side of the substrate 101. The source region 163 is a heavily doped region of a first conductivity type and may be electrically connected to a source electrode (not shown). In addition, a body contact region 161 may be formed in the body region 160 and on a side adjacent to or in contact with the source region 163. The body contact region 161 may be a heavily doped region of the first conductivity type.

A gate electrode 170 may be formed on the substrate 101. To be specific, the gate electrode 170 may be formed between the drain region 151 and the source region 163 within the active region. The gate electrode 170 is positioned on a channel region, and the on and off control of the channel region is possible by the gate voltage applied to the gate electrode 170. The gate electrode 170 may be made of, for example, conductive polysilicon, metal, conductive metal nitride, and combinations thereof, and may be formed by performing a CVD, PVD, ALD, MOALD, or MOCVD process, etc.

A gate insulating layer 171 is formed between the gate electrode 170 and the surface of the substrate 101, and the gate insulating layer 171 may be formed of any one of a silicon oxide layer, a high-k layer, and a combination thereof. The gate insulating layer 171 may be formed by performing an ALD, CVP, or PVD process.

A sidewall of the gate electrode 170 may be covered by a gate spacer 173, and the gate spacer 173 may be formed of any one of an oxide film, a nitride film, and a combination thereof.

In addition, on the substrate 101, an interlayer insulating layer 180 is formed to completely cover the gate electrode 170 and the DTI region 191. The interlayer insulating layer 180 may be formed, for example, by using a borophospho-silicate glass (BPSG) film and a tetra ethyl ortho silicate (TEOS) film, but the scope of the present disclosure is not limited thereto.

The DTI region 191 may extend vertically in the substrate 101. For example, the DTI region 191 may be formed to overlap the STI region 190, but the scope of the present disclosure is not limited thereto. The DTI region 191 may include the upper region 1911 having a relatively wide width W1 and a lower region 1913 having a relatively narrow width W2.

Hereinafter, prior to the detailed description of the DTI region 191, the structure and problems of a conventional high voltage semiconductor device 9 will be described.

Figure 1:
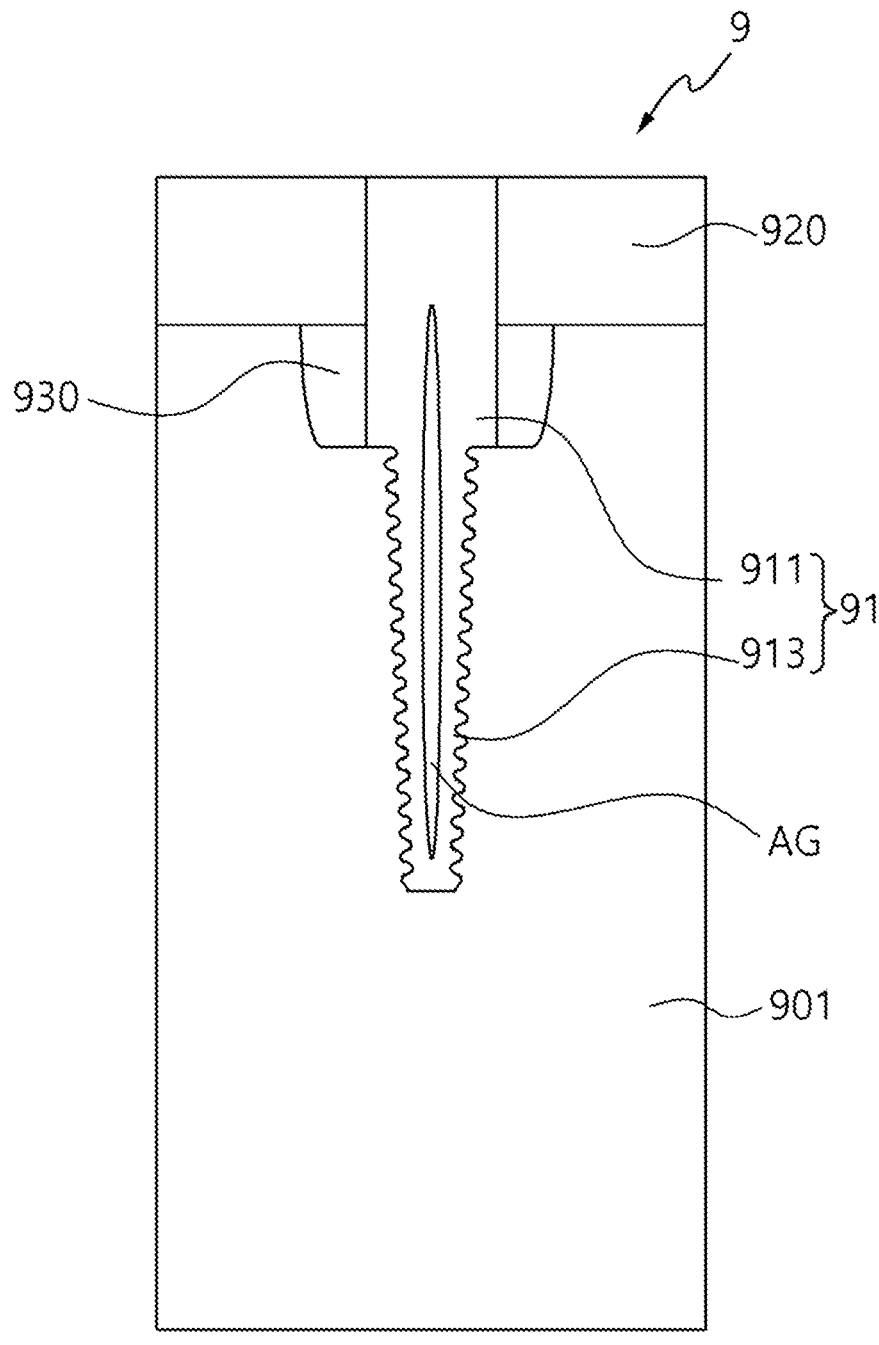
FIG. 1 is a cross-sectional view showing a conventional high voltage semiconductor device.

Referring to FIG. 1, in a conventional high voltage semiconductor device 9, in order to form an isolation region 91 to a sufficiently deep position within a substrate 901, the isolation region 91 is formed in two stages such as a Pre-DTI region 911 and a DTI region 913. That is, the Pre-DTI region 911 is formed to pass through an interlayer insulating layer 920 and a STI region 930 on the substrate 901, and the DTI region 913 is connected to the bottom of the Pre-DTI region 911 and extends to a predetermined depth in the substrate 901. At this time, the bottom of the Pre-DTI region 911 is formed at substantially the same depth as the bottom of the STI region 930 in the substrate 901.

In addition, an air gap AG is formed in the isolation region 91. When the upper end of the air gap AG is formed at a height (or depth) adjacent to the surface of the substrate 901, the possibility of cracks occurring in the Pre-DTI region 911 on the upper side of the air gap AG in a subsequent process cannot be ruled out. For example, when a subsequent process such as a contact process is performed, tungsten (W) remains inside the space created by the crack, which may cause a defect in the semiconductor device 9.

Thus, it is advantageous that the upper end of the air gap AG is formed at a position as deep as possible within the isolation region 91 in order to prevent cracks and resultant defects from occurring in subsequent processes.

To this end, referring to FIGS. 2 and 3, the upper region 1911 of the high voltage semiconductor device 1 according to an embodiment of the present disclosure is formed at a deeper position than the bottom of the STI region 190. In this case, the depth D1 of the bottom of the upper region 1911 from the surface of the substrate 101, compared to the corresponding depth D2 of the STI region 190, is preferably $1.5D2 \leq D1 \leq 2.5D2$, and $1.8D2$ More preferably $\leq D1 \leq 2.1D2$. When the depth D1 of the bottom of the upper region 1911 is greater than 2.5D2, there is no significant difference in the formation depth of the upper part of the air gap AG compared to the case where the depth D1 is less than 2.5D2.

When the depth D1 of the bottom of the upper region 1911 is less than 1.5D2, there is a possibility that the upper end of the air gap AG may not be formed deep enough to prevent cracks. It should be noted that the description of the above numerical limitation is only illustrative and the scope of the present disclosure is not limited by the above description.

The formation depth of the upper region 1911 may be controlled by adjusting the process time during the substrate 101 etching process. The upper region 1911 may have a structure passing through the interlayer insulating layer 180.

In addition, the lower region 1913 may be formed to be connected to the bottom of the upper region 1911. The lower region 1913 may be formed such that the side part thereof extends substantially in the vertical direction or is inclined, but there is no limitation thereto. As described above, the lower region 1913 may be narrower than the upper region 1911 in width. Both the upper region 1911 and the lower region 1913 may be gap-filled with the same material as the interlayer insulating layer 180, but may also be gap-filled with other insulating layers, but is not limited thereto.

The formation depth of the DTI region 191 including the upper region 1911 and the lower region 1913 is preferably about 10 μm or more and 40 μm or less from the surface of the substrate 101, for example, and more preferably about 35 μm, but it should be noted that the scope of the present disclosure is not limited by a specific value/range of values.

Referring to FIG. 2, an upper insulating layer 195 may be deposited on the DTI region 191 and the interlayer insulating layer 180. The upper insulating f layer 195 may be a TEOS film, but the scope of the present disclosure is not limited thereto. The upper insulating f layer 195 is a layer for removing the step difference and will be described in detail in the following manufacturing method.

FIGS. 4 to 15 are cross-sectional views showing a method of manufacturing a high voltage semiconductor device according to an embodiment of the present disclosure.

Hereinafter, a method of manufacturing the high voltage semiconductor device according to the embodiment of the present disclosure will be described in detail with reference to the accompanying drawings. For convenience of explanation, descriptions of the well regions, the buried layer, the source region, the drain region, and the gate electrode on the substrate are omitted, and the process before and after the formation of the DTI region 190 will be mainly described.

Figure 4:
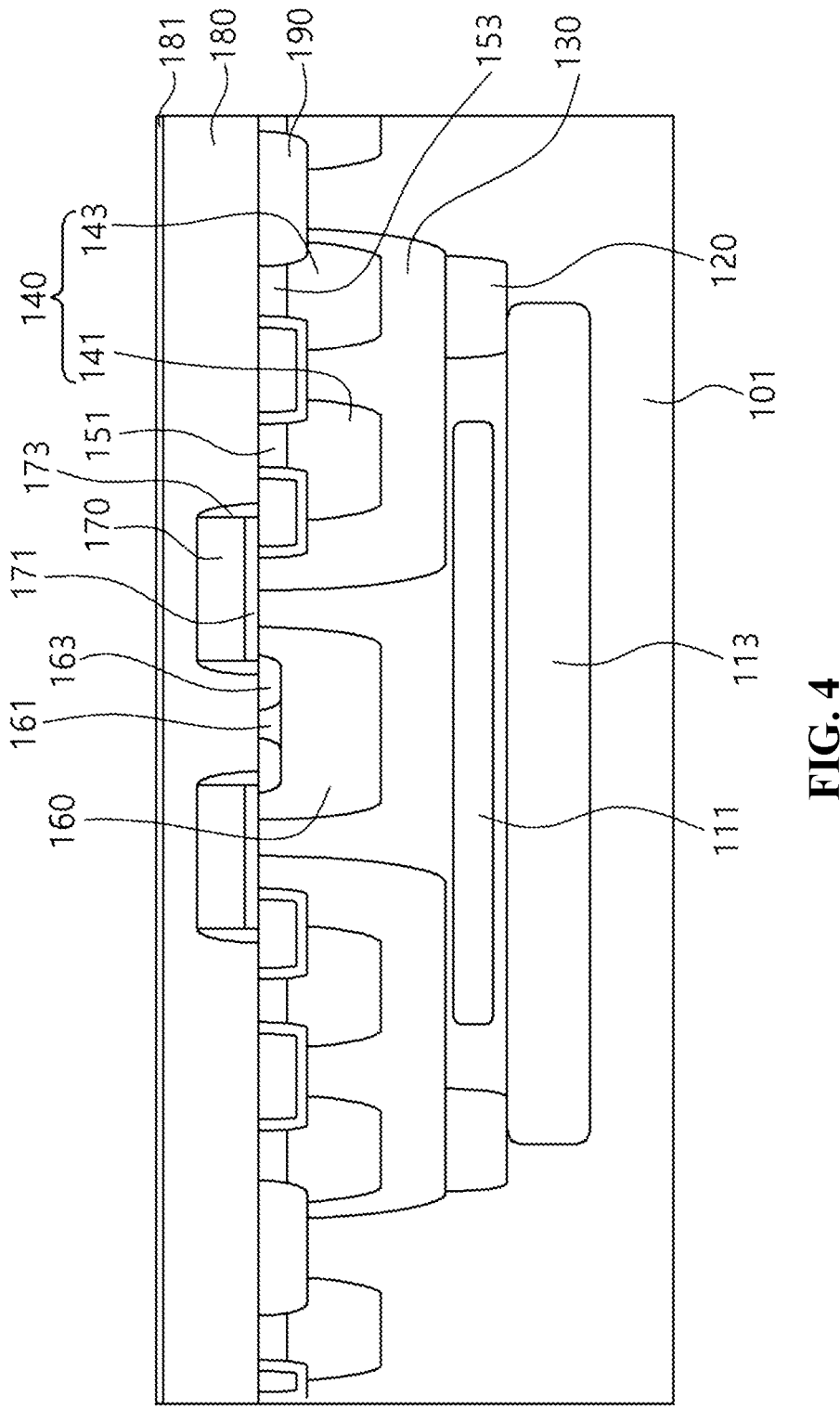
FIGS. 4 to 15 are cross-sectional views showing a method of manufacturing a high voltage semiconductor device according to an embodiment of the present disclosure.
Figure 5:
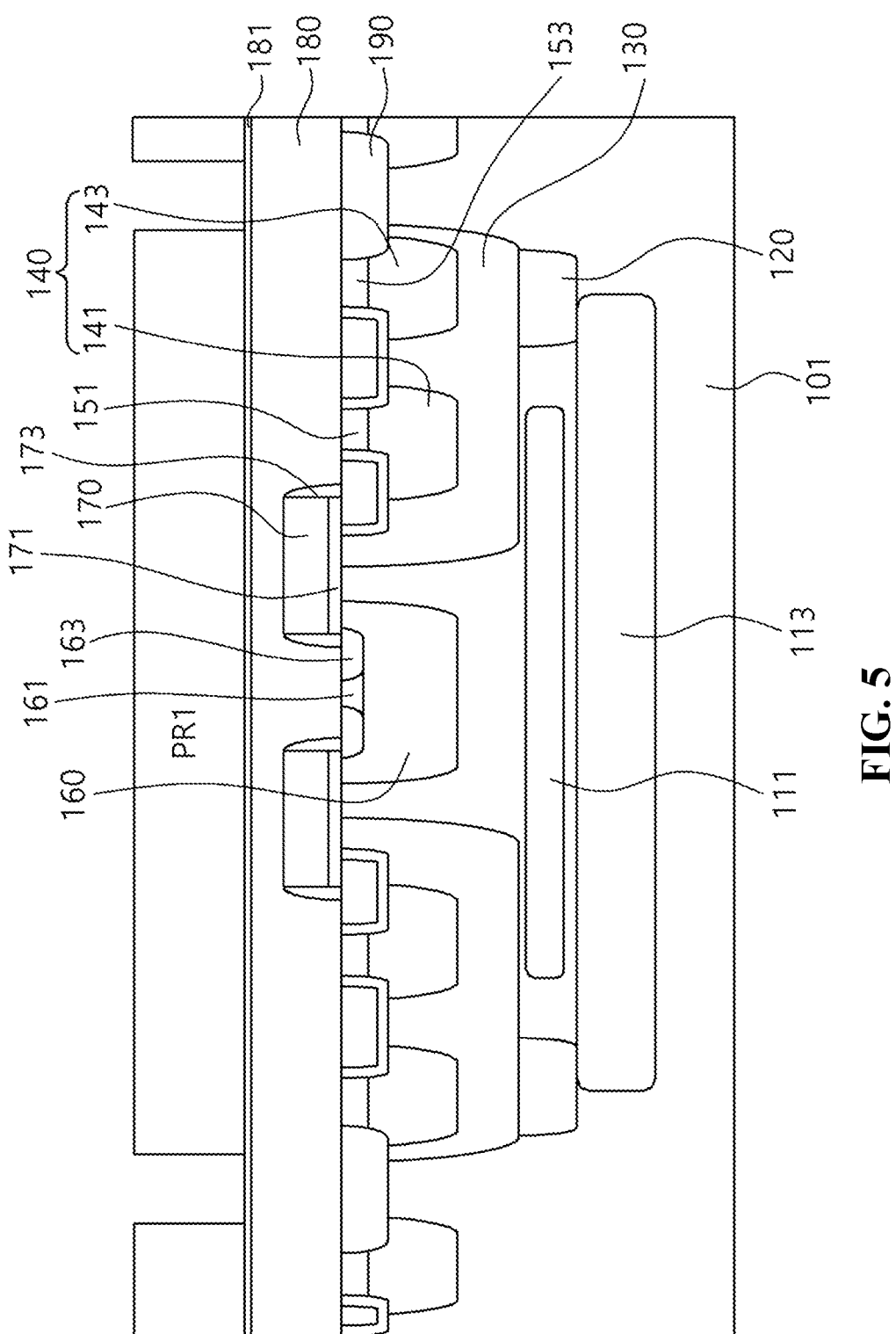
Figure 6:
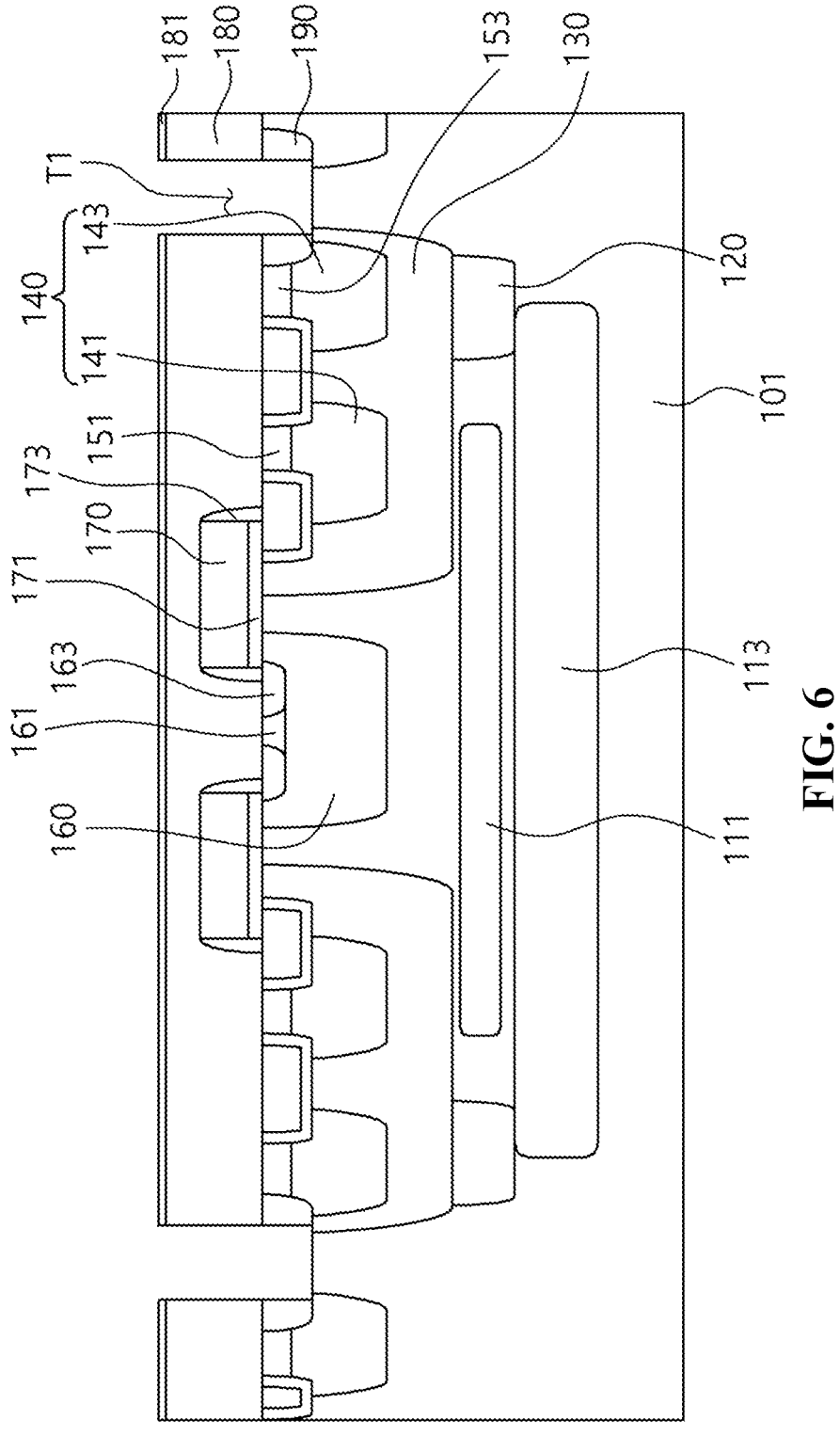
Figure 7:
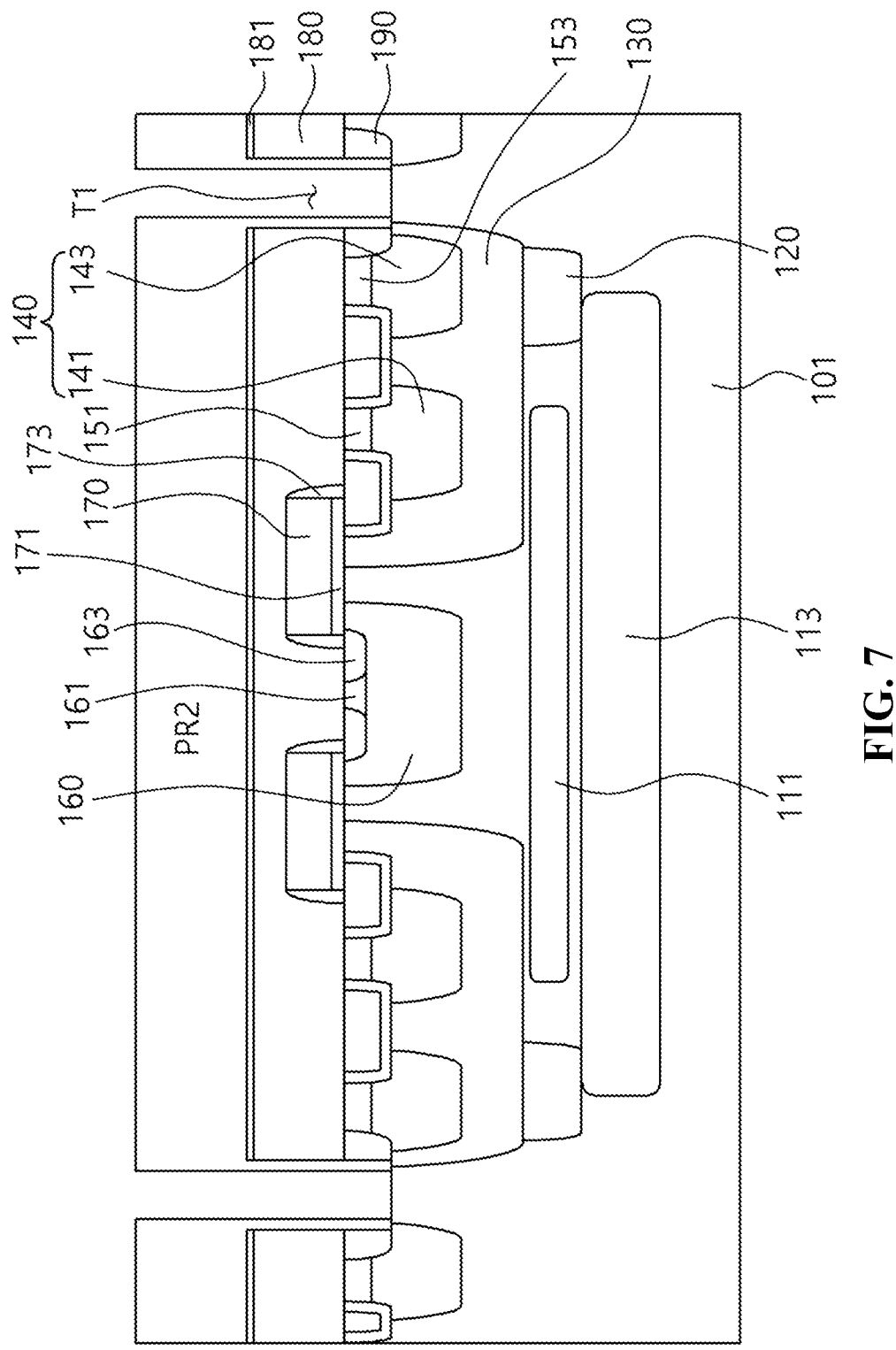
Figure 8:
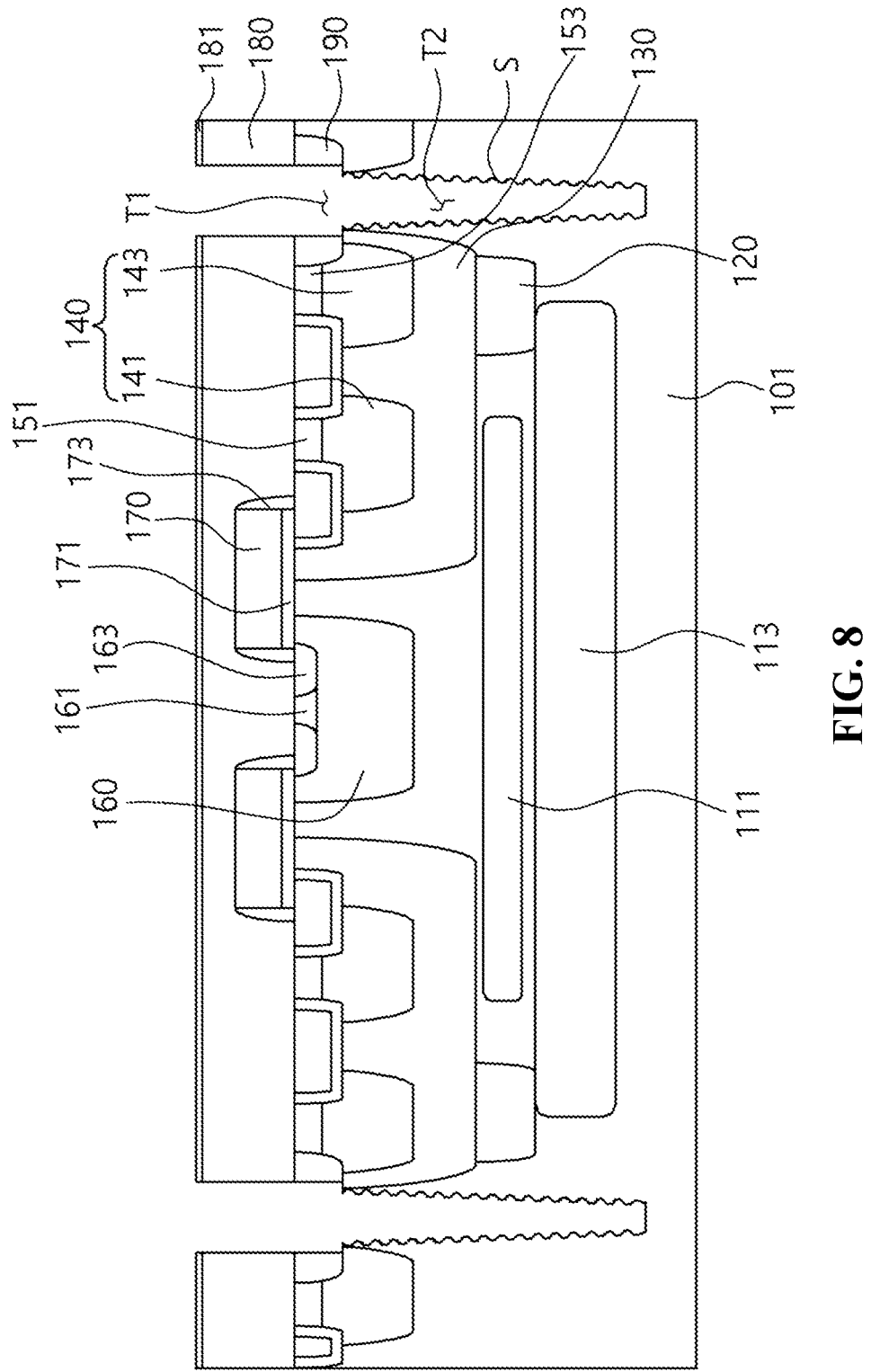

Referring to FIG. 4, first, the interlayer insulating layer 180 is deposited on the substrate 101 on which the gate electrode 170 is formed. The interlayer insulating layer 180 may be formed of, for example, a BPSG film and a TEOS film, but is not limited thereto. Thereafter, an etch stop layer 181 is formed on the interlayer insulating layer 180. The etch stop layer 181 is a CMP etch stop layer in a subsequent CMP process and may be formed of, for example, a SiN layer.

Thereafter, the etch stop layer 181, the interlayer insulating layer 180, and the STI region 190 are sequentially etched to overlap the STI region 190 to form a first trench T1 in which a part of the upper region 1911 is to be formed. In this case, the bottom of the first trench T1 is preferably formed at substantially the same depth as the bottom of the STI region 190. A process of forming the first trench T1 will be described in detail. For example, a photoresist layer PR1 having an open side on which the first trench T1 is to be formed on the etch stop layer 181 is patterned (see FIG. 5). Next, the etch stop layer 181, the interlayer insulating layer 180, and the STI region 190 are sequentially etched to form the first trench T1 (see FIG. 6). Then, the photoresist layer PR1 is removed, which may be performed through a strip process and a cleaning process.

Thereafter, a second trench T2 in which the lower region 1913 is to be formed may be formed. The bottom of the second trench T2 is preferably formed at a depth of 30 to 40 μm from the surface of the substrate 101. At this time, the second trench T2 may have a narrower width than the first trench T1, and may be inclined as the inner wall thereof extends downward or may have a substantially uniform width, but is not limited thereto.

A process of forming the second trench T2 will be described. For example, a photoresist layer PR2 is patterned on the etch stop layer 181 and along the inner wall of the first trench T1 (see FIG. 7). Then, the substrate 101 below the first trench T1 is etched (see FIG. 8). After forming the second trench T2, the photoresist layer PR2 is removed, which may be performed through a strip process and a cleaning process. When forming the second trench T2, a Bosch process is performed. At this time, due to the nature of the Bosch process, rugged or continuous water drop-shaped scallops S are formed on the inner wall of the second trench T2 (see FIG. 8). Since the scallop S exists from the upper end of the second trench T2, the width of the uppermost part of the second trench T2 inevitably becomes narrower, and this may be a factor in forming the upper part of the air gap AG at a position higher than the DTI region 191. Thus, the possibility of occurrence of cracks is relatively increased.

Figure 9:
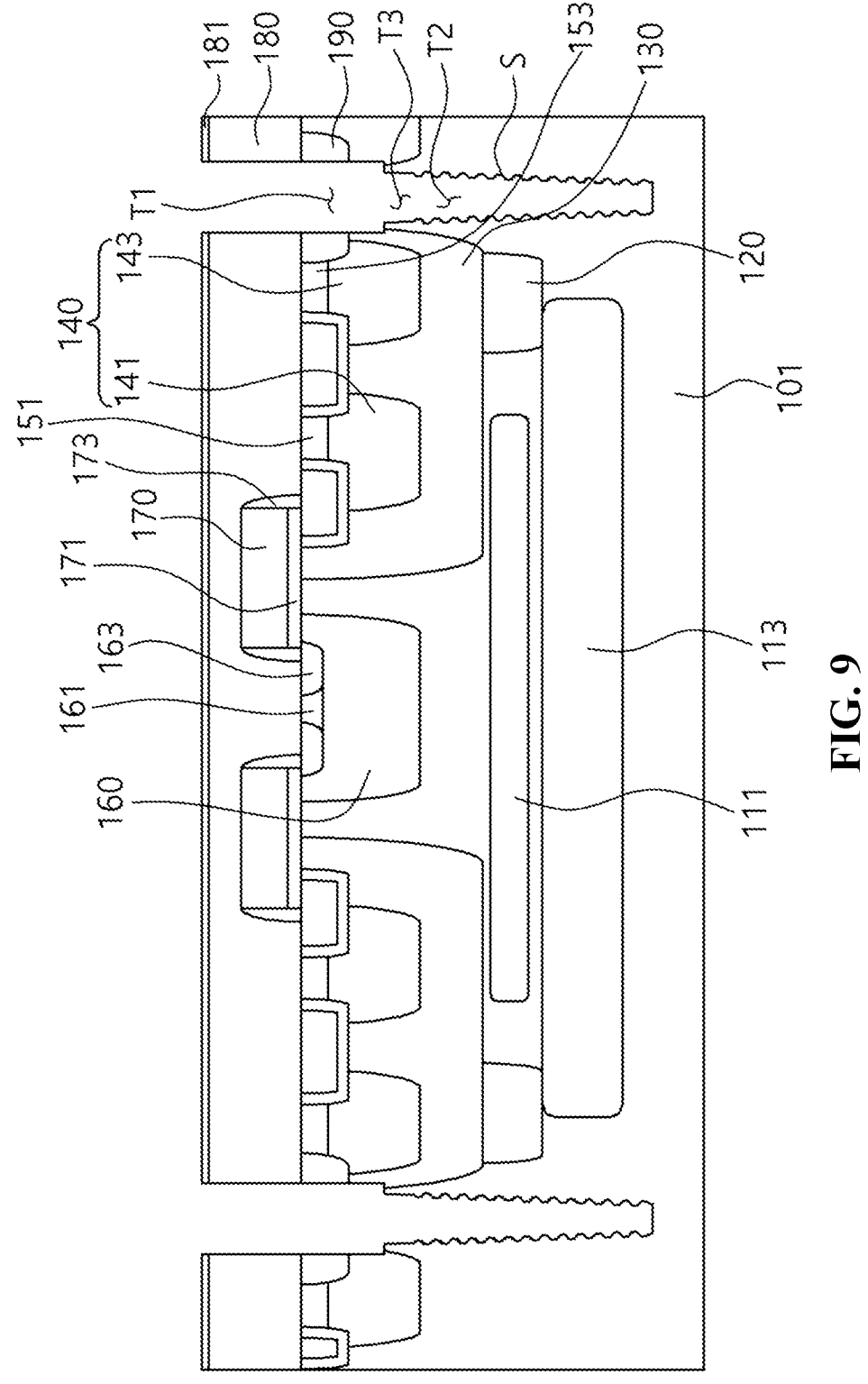

Referring to FIG. 9, after forming the second trench T2, the substrate 101 contacting the bottom of the first trench T1 is etched to additionally form an open extension region T3. At this time, the etching depth of the substrate 101 corresponds to D1-D2. As described above, the formation depth of the extension region T3 may be controlled by adjusting the process time during the etching process of the substrate 101. When forming the open extension region T3, a process of forming a separate photoresist pattern is not performed. In addition, the etching process performed when forming the open extension region T3 is a Non-Bosch process, and the scallop S formed in the existing second trench T2 may be at least partially removed.

Figure 10:
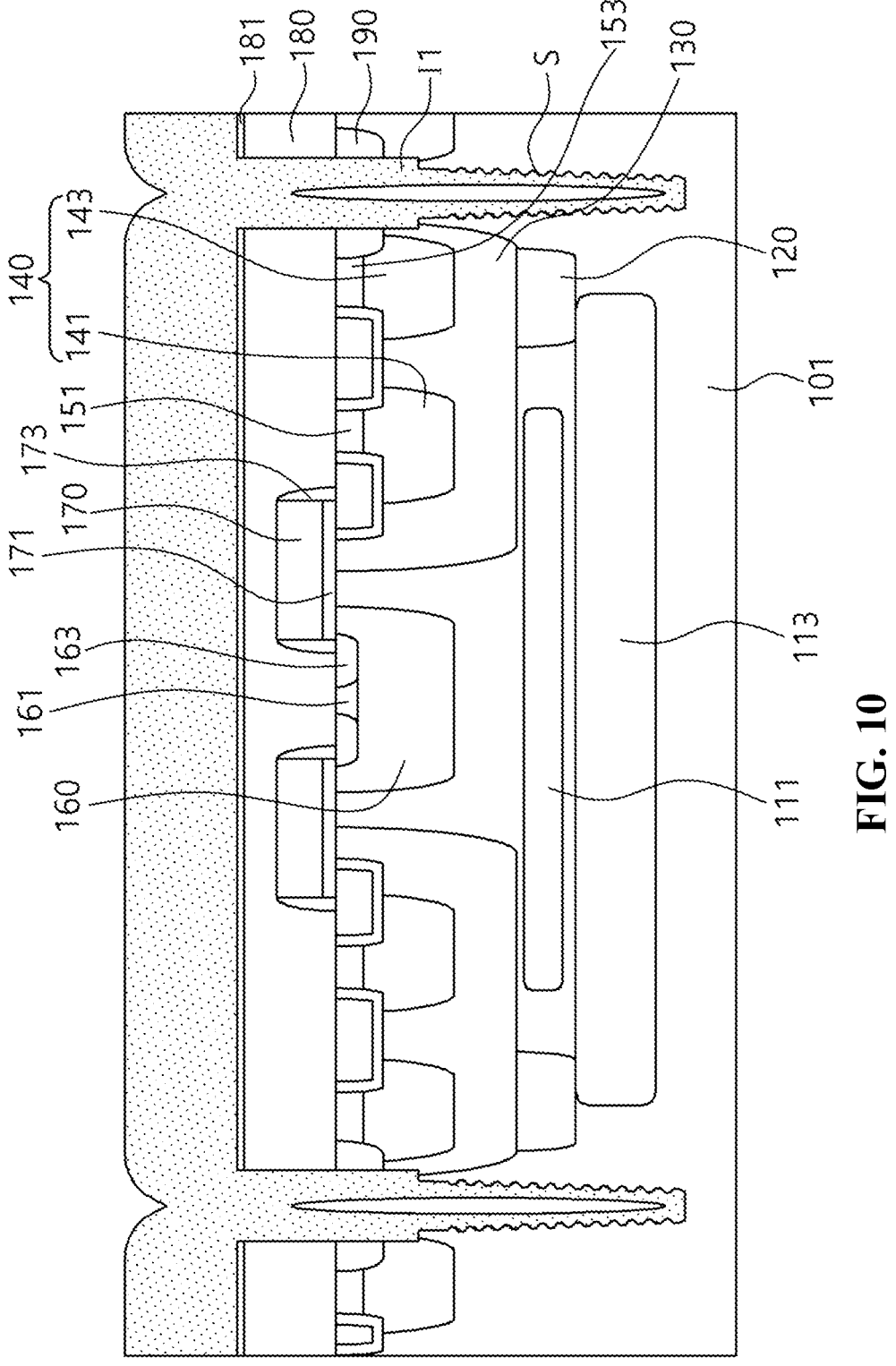

Thereafter, referring to FIG. 10, a first insulating layer I1 is deposited on the etch stop layer 181 and in the first trench T1, the second trench T2, and the open extension region T3. In this case, the first insulating layer I1 may be a TEOS layer, but the scope of the present disclosure is not limited thereto.

Figure 11:
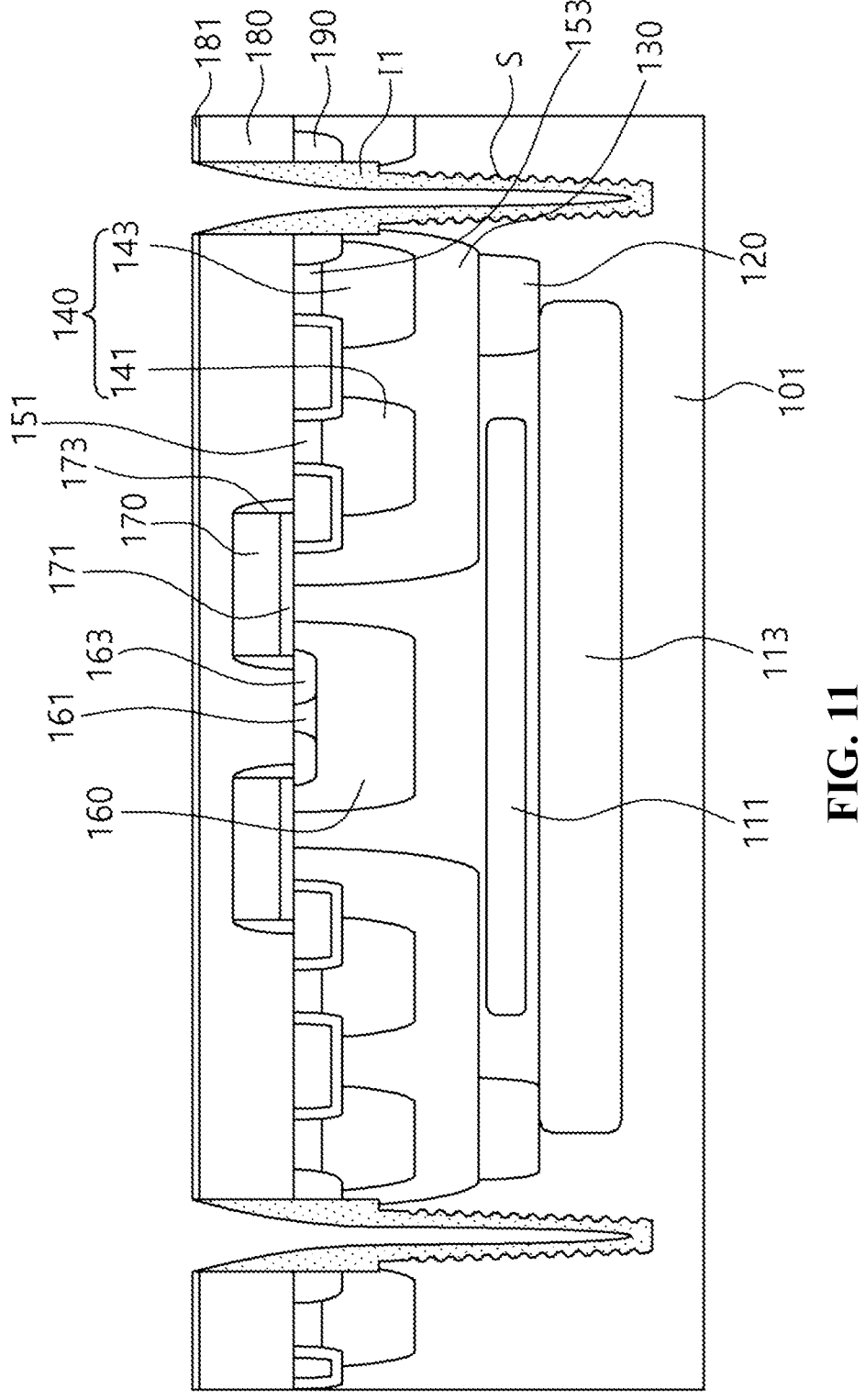

Thereafter, referring to FIG. 11, by performing an etchback process on the first insulating layer I1, the first insulating layer I1 on the etch stop layer 181 and in the first trench T1, the second trench T2, and the open extension region T3 is at least partially removed. Through this process, the first insulating layer I1 remains along the inner wall of the first trench T1 in the form of a side-wall. That is, the first insulating layer I1 on the inner wall of the first trench T1 may remain narrower as it extends upward from the bottom of the first trench T1. Thus, the width of the open space of the first trench T1 may be further narrowed at a relatively low depth (or height). This is a factor in forming the upper end of the air gap AG at a lower depth during the deposition of a second insulating layer 12 in the next process.

Figure 12:
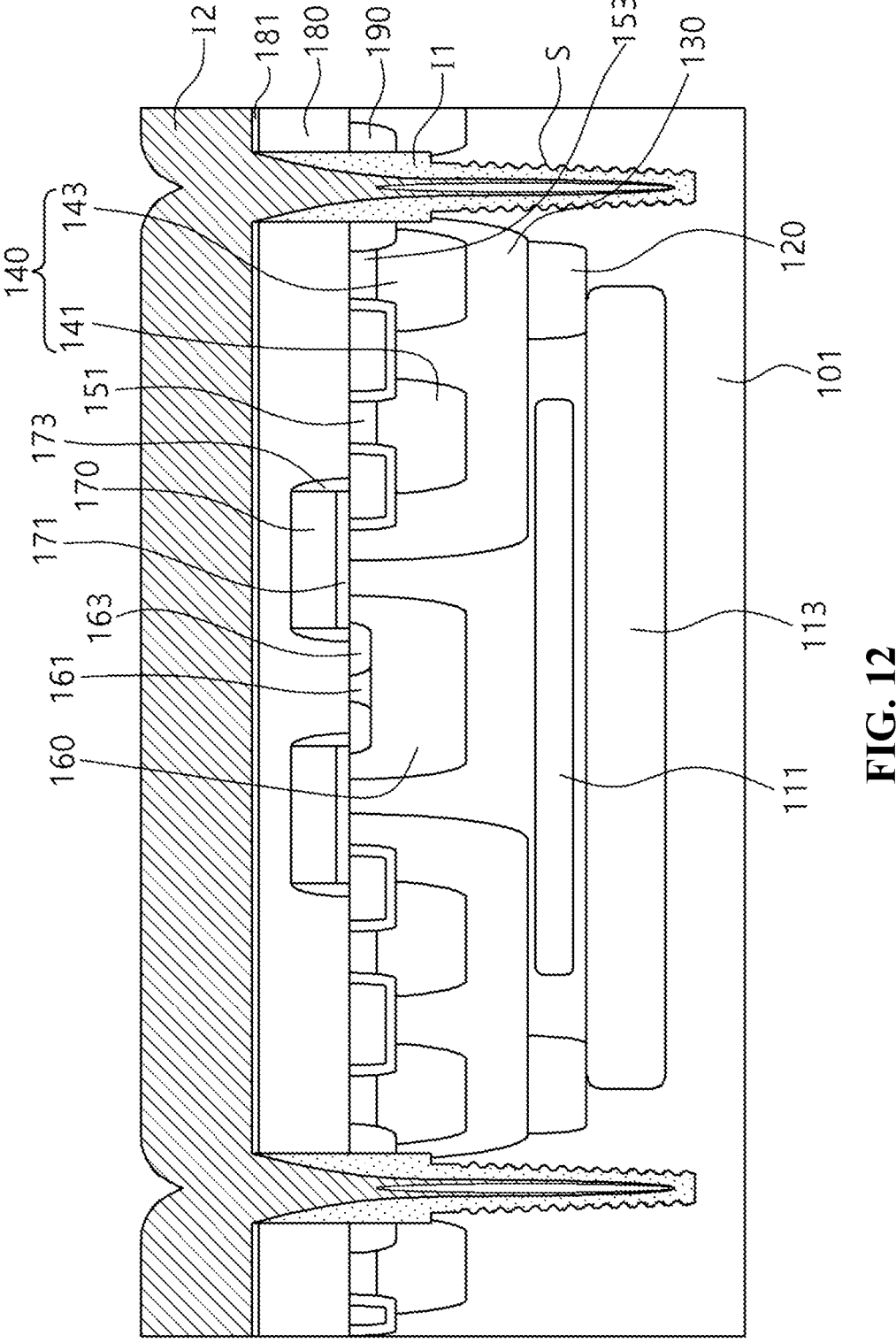

Referring to FIG. 12, as a subsequent process, the second insulating layer 12 is deposited on the etch stop layer 181 and inside the first trench T1 and the second trench T2 and the open extension region T3. The second insulating layer 12 may include substantially the same material as the first insulating layer I1.

Figure 13:
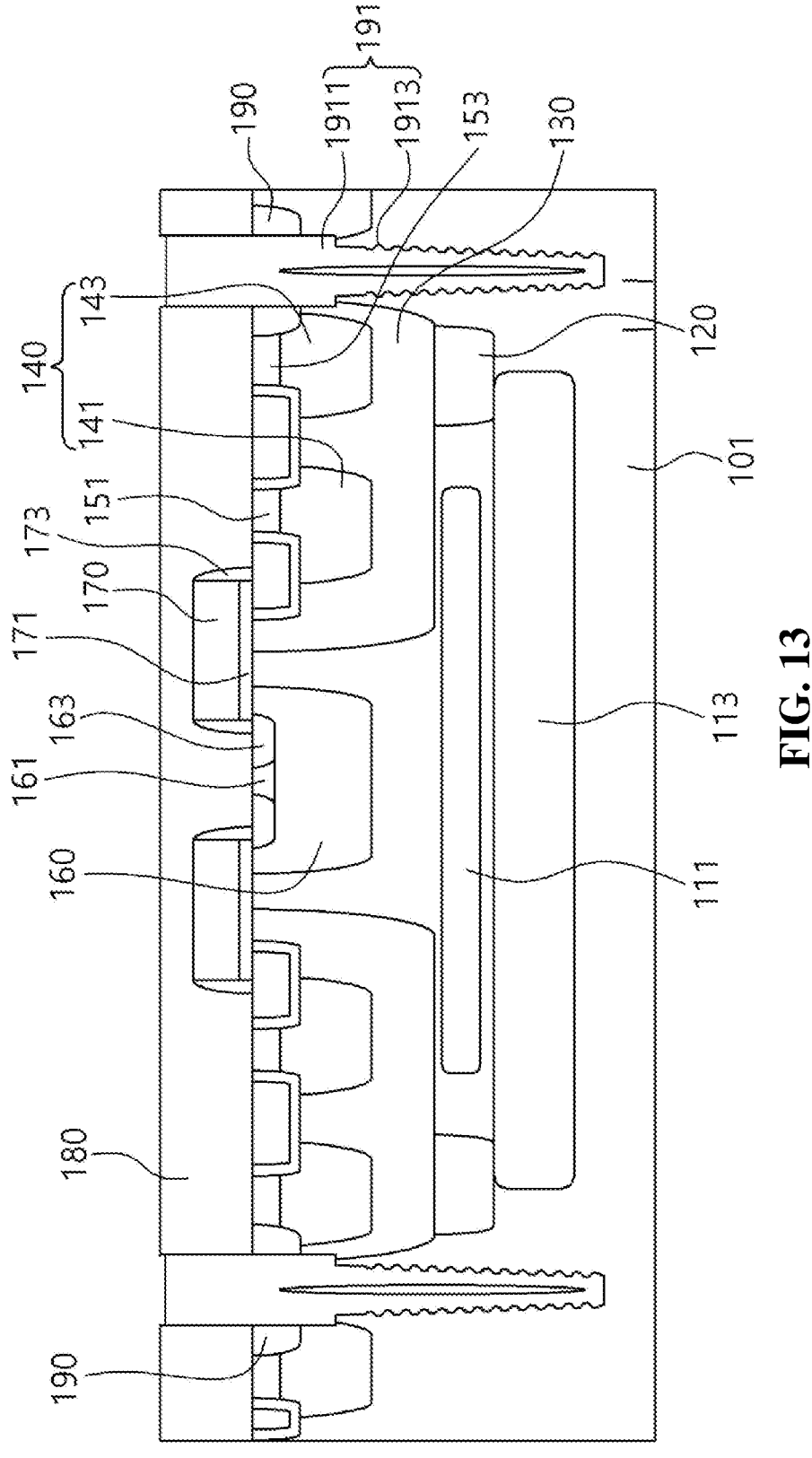
Figure 14:
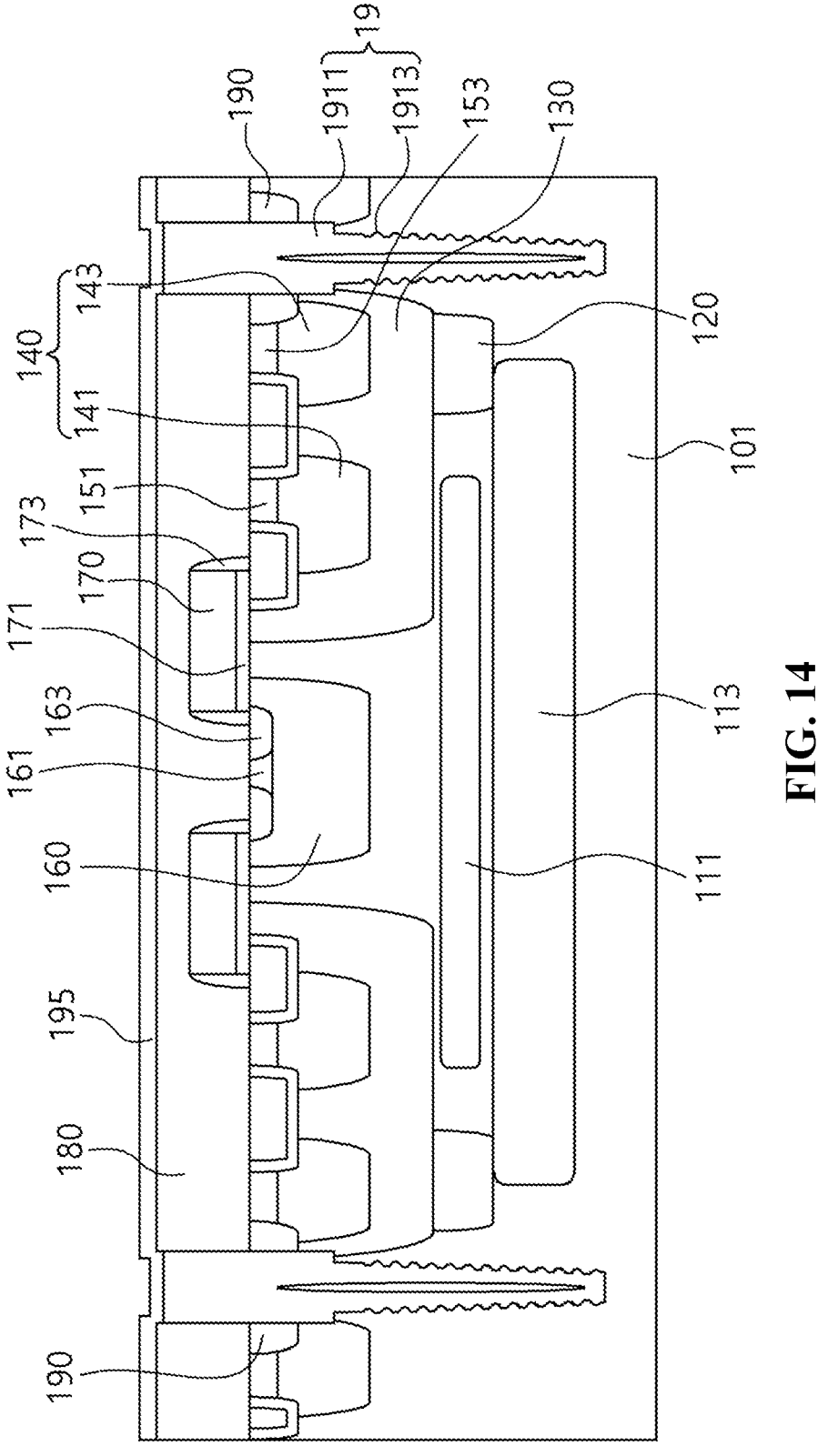
Figure 15:
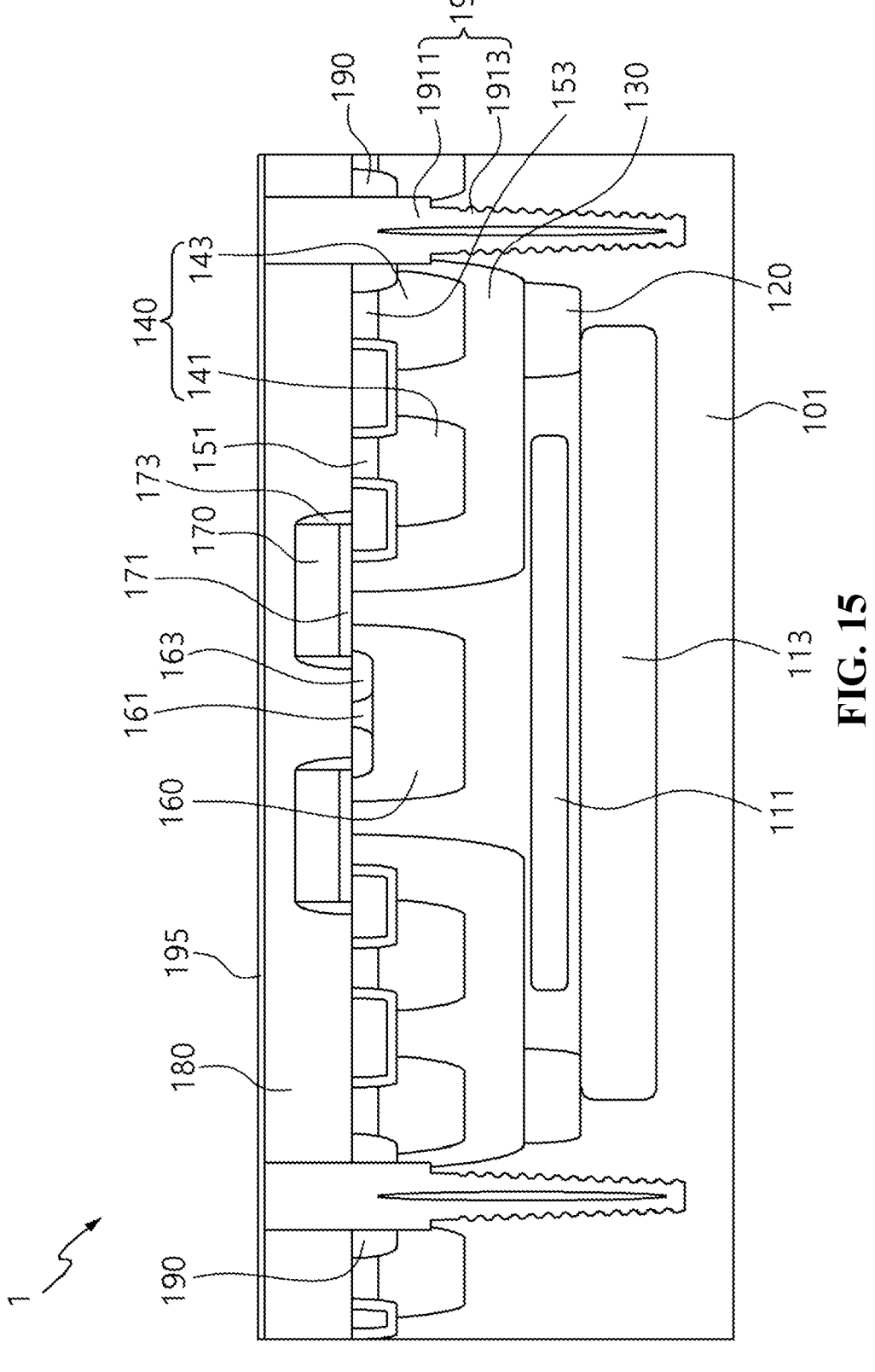

Thereafter, referring to FIG. 13, a process of removing the second insulating layer 12 on the etch stop layer 181 is performed, which may be performed through a CMP process. Afterwards, the etch stop layer 181 may be removed.

At this time, since the etch stop layer 181 is removed while the upper portion of the upper region 1911 is open, the upper portion of the upper region 1911 is also partially removed. That is, oxide loss occurs in the upper region 1911. Thus, a step is created between the upper region 1911 and the interlayer insulating layer 180 adjacent thereto, and there is a possibility that tungsten (W) remains in the upper portion of the upper region 1911, which is partially depressed compared to the surrounding area during the subsequent process for forming the contact. Therefore, a step removal process is required. To this end, referring to FIG. 14, an upper insulating layer 195 is deposited on the interlayer insulating layer 180. Thereafter, referring to FIG. 15, a CMP process is performed on the upper insulating layer 195.

The above detailed description is illustrative of the present disclosure. In addition, the above description shows and describes preferred embodiments of the present disclosure, and the present disclosure can be used in various other combinations, modifications, and environments. In other words, changes or modifications are possible within the scope of the concept of the disclosure disclosed herein, the scope equivalent to the written disclosure, and/or within the scope of skill or knowledge in the art. The above-described embodiment describes the best state for implementing the technical idea of the present disclosure, and various changes required in the specific application field and use of the present disclosure are possible. Accordingly, the detailed description of the present disclosure is not intended to limit the present disclosure to the disclosed embodiments.

What is claimed is:

1. A high voltage semiconductor device, comprising:
a substrate;
a gate electrode on the substrate;
a STI region formed as an isolation layer in the substrate;
a DTI region in the substrate; and
an air gap in the DTI region,
wherein the DTI region comprises:
an upper region at least partially overlapping the STI region; and
a lower region extending downward from a lower end of the upper region,
wherein an upper end of the lower region has a smaller width than that of the lower end of the upper region, thereby defining a stepped portion at an interface between the upper region and the lower region, and
wherein the lower end of the upper region is located at a lower position than a lower end of the STI region.

2. The high voltage semiconductor device of claim 1, further comprising:

an interlayer insulating layer covering the gate electrode on the substrate, wherein the upper region penetrates the interlayer insulating layer.

3. The high voltage semiconductor device of claim 2, further comprising:

an upper insulating layer on the interlayer insulating layer.

4. The high voltage semiconductor device of claim 1, wherein a depth of the lower end of the upper region from a surface of the substrate is greater than 1.5 times and less than 2.5 times that of the STI region.

5. The high voltage semiconductor device of claim 1, wherein the upper region is formed by a plurality of etching processes.

6. The high voltage semiconductor device of claim 1, further comprising:

a buried layer of a second conductivity type in the substrate;

a deep well region connected to the buried layer of the second conductivity type;

a first well region in the deep well region; and an interlayer insulating layer covering the gate electrode on the substrate.

7. The high voltage semiconductor device of claim 6, wherein a depth of the lower end of the upper region from a surface of the substrate is greater than 1.8 times and less than 2.1 times that of the STI region.

8. The high voltage semiconductor device of claim 6, further comprising:

a drain region of the second conductivity type disposed in the first well region adjacent to a surface of the substrate;

a body region of a first conductivity type in the substrate; and a source region of the second conductivity type disposed in the body region adjacent to the surface of the substrate.

9. The high voltage semiconductor device of claim 6, wherein the upper region is formed by a plurality of non-Bosch processes.

* * * * *